(12) United States Patent
Tagami

(10) Patent No.: US 6,580,300 B2
(45) Date of Patent: Jun. 17, 2003

(54) POLYPHASE SIGNAL GENERATOR

(75) Inventor: Hitoyuki Tagami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/098,521

(22) Filed: Mar. 18, 2002

(65) Prior Publication Data

US 2003/0085746 A1 May 8, 2003

(30) Foreign Application Priority Data

Nov. 8, 2001 (JP) .................................. 2001-343144

(51) Int. Cl.[7] ............................................. H03H 11/16
(52) U.S. Cl. ......................................... 327/254; 327/258
(58) Field of Search ................................. 327/231, 239, 327/242, 246, 247, 250–259, 269, 238

(56) References Cited

U.S. PATENT DOCUMENTS 5,818,276 A * 10/1998 Garrity et al. ............... 327/259
5,999,030 A * 12/1999 Inoue ........................ 327/258

FOREIGN PATENT DOCUMENTS

| JP | 52-64263 | 5/1977 |
| JP | 53-1444 | 1/1978 |
| JP | 63-280511 | 11/1988 |
| JP | 8-79029 | 3/1997 |
| JP | 9-139921 | 5/1997 |
| JP | 10-215241 | 8/1998 |
| JP | 11-74766 | 3/1999 |
| JP | 11-150456 | 6/1999 |
| JP | 2000-194438 | 7/2000 |

OTHER PUBLICATIONS

K. Yamaguchi Et Al., "A 2.5–GH 4–phase Clock Generator with Scalable and No Feedback Loop Architecture", Proceedings of the 2001 IEICE General Conference, Mar. 7, 2001, p. 106, The Institute of Electronics Information and Communication Engineers (IEICE), Japan (with English translation).

* cited by examiner

*Primary Examiner*—Toan Tran
(74) *Attorney, Agent, or Firm*—Burns, Doane, Swecker & Mathis, LLP

(57) ABSTRACT

The polyphase signal generator includes a first delay circuit which adds a first predetermined phase delay to an input signal, a first phase interpolation circuit which generates a first output signal having an output phase prescribed according to a phase difference between the input signal input to one terminal of the first output signal generation unit and a signal input to another terminal of the first output signal generation unit which is output from the delay addition unit, and a second phase interpolation circuit which generates a second output signal having an output phase prescribed according to a phase difference between a signal input to one terminal of the second output signal generation unit which is output from the delay addition unit and an inverted signal of the input signal input to another terminal of the second output signal generation unit.

3 Claims, 2 Drawing Sheets

FIG.2
CONVENTIONAL
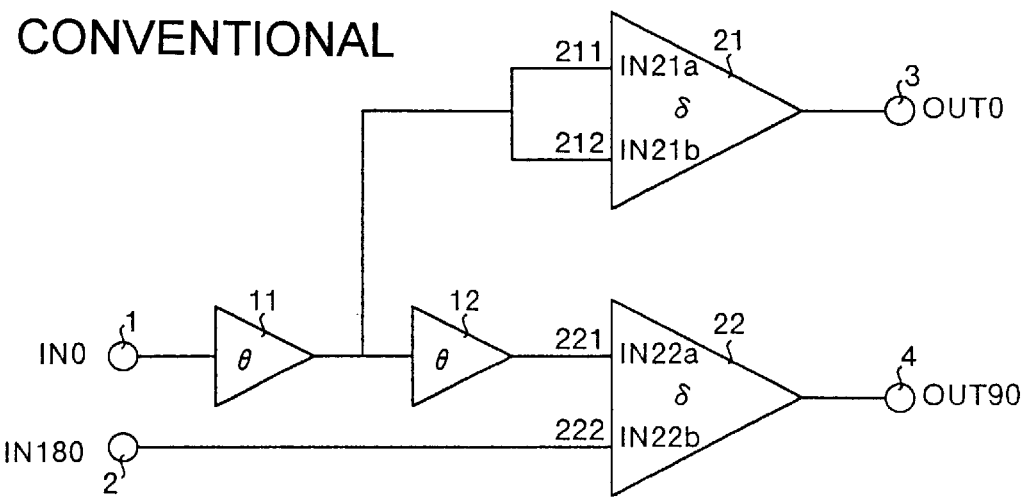

POLYPHASE SIGNAL GENERATOR

FIELD OF THE INVENTION

The present invention relates to a polyphase signal generator which generates signals spaced in phase 90 degrees apart. In particular, this invention relates to a polyphase signal generator which implements the equivalent function with a small-scale circuit configuration.

BACKGROUND OF THE INVENTION

A conventional four-phase signal generator will be taken as an example of a conventional polyphase signal generator. FIG. 2 shows a configuration of a conventional four-phase signal generator which is explained in C-12-11, 2001 National Convention Record of the Institute of Electronics, Information and Communication Engineers of Japan.

In FIG. 2, reference number 1 denotes a first signal input terminal, 2 denotes a second signal input terminal, 3 denotes a first signal output terminal, 4 denotes a second signal output terminal, 11 denotes a first delay circuit, 12 denotes a second delay circuit, 21 denotes a first phase interpolation circuit, 22 denotes a second phase interpolation circuit, 211 denotes a third signal input terminal, 212 denotes a fourth signal input terminal, 221 denotes a fifth signal input terminal, and 222 denotes a sixth signal input terminal.

Operation of the conventional four-phase signal generator will now be explained. The first delay circuit 11 and the second delay circuit 12 have the same configuration and provide equal phase delays θ. The first phase interpolation circuit 21 and the second phase interpolation circuit 22 have the same configuration and equal internal phase delays δ. A signal phase of the third signal input terminal 211 is denoted by IN21a. A signal phase of the fourth signal input terminal 212 is denoted by IN21b. A signal phase of the fifth signal input terminal 221 is denoted by IN22a. A signal phase of the sixth signal input terminal 222 is denoted by IN22b. An output signal phase of the first signal output terminal 3 is denoted by OUT0, and an output signal phase of the second signal output terminal is denoted by OUT90.

Signals spaced in phase 180 degrees apart are input to the first signal input terminal 1 and the second signal input terminal 2. The phase shift of 180 degrees can be obtained easily by inverting a signal. Denoting a signal phase of the first signal input terminal 1 by IN0 and a signal phase of the second signal input terminal 2 by IN180, therefore, the following equations are satisfied as regards signal phases.

$$IN0=0 \quad (1)$$

$$IN180=180 \quad (2)$$

An output of the first delay circuit 11 is connected to both the third signal input terminal 211 and the fourth signal input terminal 212. As regards the phases, therefore, the following equation is satisfied.

$$IN21a=IN21b=IN0+\theta=\theta \quad (3)$$

An output of the second delay circuit 12 is connected to the fifth signal input terminal 221. The second signal input terminal 2 is connected to the sixth signal input terminal 222. Therefore, the following equations are satisfied as regards signal phases.

$$IN22a=IN0+2\cdot\theta=2\cdot\theta \quad (4)$$

$$IN22b=IN180=180 \quad (5)$$

The first phase interpolation circuit 21 and the second phase interpolation circuit 22 output signals with output phases represented by the following equations in response to two signal input phases.

$$\begin{aligned} OUT0 &= \delta + (IN21a + IN21b)/2 \\ &= \delta + \theta \end{aligned} \quad (6)$$

$$\begin{aligned} OUT90 &= \delta + (IN22a + IN22b)/2 \\ &= \delta + (2\cdot\theta + 180)/2 \\ &= \delta + \theta + 90 \end{aligned} \quad (7)$$

It will be appreciated from the equations (6) and (7) that the signal phase of the first signal output terminal 3 and the signal phase of the second signal output terminal 4 always maintain the phase difference relation of 90 degrees irrespective of the phase delay θ of the first delay circuit 11 and the second delay circuit 12 and the internal phase delay δ of the first phase interpolation circuit 21 and the second phase interpolation circuit 22. In other words, even when the phase delays θ and δ are varied by a variation of an environment such as the operation temperature or the power supply voltage, four-phase signals spaced in phase accurately 90 degrees apart can be obtained from the output signal of the first signal output terminal 3, the output signal of the second signal output terminal 4, an inverted output signal of the first signal output terminal 3, and an inverted output signal of the second signal output terminal 4.

Operation of the phase interpolation circuits will now be explained. FIG. 3 is a diagram showing an example of a detailed configuration of the first phase interpolation circuit 21 and the second phase interpolation circuit 22. In FIG. 3, reference number 51 denotes a high potential power supply voltage, 52 denotes a low potential power supply voltage, 53 denotes a first positive-phase input terminal, 54 denotes a first negative-phase input terminal, 55 denotes a second positive-phase input terminal, 56 denotes a second negative-phase input terminal, 57 denotes a positive-phase output terminal, 58 denotes a negative-phase output terminal, 59 denotes a first current source, 60 denotes a second current source, 61–64 denote NPN transistors, and 65 and 66 denote resistors. The first signal output terminal 3 and the second signal output terminal 4 shown in FIG. 1 correspond to the positive-phase output terminal 57 and the negative-phase output terminal 58 shown in FIG. 3.

The first current source 59 and the second current source 60 flow currents of the same current value I0. The NPN transistors 61 to 64 have the same characteristic. The resistor 65 and the resistor 66 have the same resistance value R. The first positive-phase input terminal 53 is the third signal input terminal 211 shown in FIG. 2. The second positive-phase input terminal 55 is the fourth signal input terminal 212 shown in FIG. 2. Each of the first negative-phase input terminal 54 and the second negative-phase input terminal 56 is supplied with a reference voltage.

Supposing an input signal IN21a of the first positive-phase input terminal 53 and an input signal IN21b of the second positive-phase input terminal 55 to be sine waveforms, t to be time, ϕ(t) to be a phase at the time t, ξ to be a phase difference between IN21a and IN21b, and Vref to be the reference voltage applied to the first negative-phase input terminal 54 and the second negative-phase input terminal 56, the input signal IN21a and the input signal IN21b can be represented by the following equations.

$$IN21a = Vref + \sin \phi(t) \quad (8)$$

$$IN21b = Vref + \sin\{\phi(t)+\xi\} \quad (9)$$

If each of a differential pair formed of the NPN transistors 61 and 62 and a differential pair formed of the NPN transistors 63 and 64 conducts a linear operation in response to its input signal, it divides a current source current I0 in proportion to an amplitude of the input signal. Supposing a high potential power supply voltage 51 to be Vcc, therefore, a collector current Ia1 of the NPN transistor 61, a collector current Ib1 of the NPN transistor 63, and an output voltage V2 of the negative-phase output terminal 58 can be represented by the following equations.

$$Ia1 = (I0/2)\{1 + \sin\varphi(t)\} \quad (10)$$

$$Ib1 = (I0/2)\ [1 + \sin\{\varphi\}\ (t) + \zeta] \quad (11)$$

$$\begin{aligned}V2 &= Vcc - R\{Ia1 + Ia2\} \\ &= Vcc - R(I0/2)\ [2 + \sin\varphi(t) + \sin\{\varphi(t) + \zeta\}] \\ &= Vcc - R(I0/2)\ [2 + 2\times\cos(\zeta/2)\times\sin\{\varphi(t)+\zeta/2\}] \\ &= Vcc - R\times I0\ [1 + \cos(\zeta/2)\times\sin\{\varphi(t)+\zeta/2\}] \\ &= Vbias - Vpp\times\sin\{\varphi(t)+\zeta/2\}\end{aligned} \quad (12)$$

In the equations, Vbias is a bias voltage of an output signal, and Vpp is a maximum amplitude of the output signal. They can be represented by the following equations.

$$Vbias = Vcc - R\times I0 \quad (13)$$

$$Vpp = R\times I0\times\cos\{\zeta/2\} \quad (14)$$

An output voltage V1 of the positive-phase output terminal 57 can be represented by the following equation as a result of derivation similar to that in the foregoing explanation.

$$V1 = Vbias + Vpp\times\sin\{\phi(t)+\zeta/2\} \quad (15)$$

Thus, in each phase interpolation circuit, the phase of the output signal becomes $\zeta/2$ in response to the two input signals having the phase difference $\zeta$, as represented by the equations (12) and (15). If, for example, the internal phase delay 8 is added, therefore, the equation (6) and the equation (7) regarding the phases are satisfied.

In the conventional polyphase signal generator, the signals spaced in phase 90 degrees apart are generated by using the two delay circuits 11 and 12 and the two phase interpolation circuits 21 and 22 as described above. Thus, there is a room for improvement in reduction of the size of the circuit and power dissipation.

SUMMARY OF THE INVENTION

It is an object of the present invention to obtain a polyphase signal generator in which the similar function can be implemented by using a circuit configuration which is smaller in scale as compared with the conventional configuration. Moreover, it is another object of this invention to achieve reduction of the power dissipation.

The polyphase signal generator according to the present invention comprises a signal receiving terminal which receives an input signal, a delay addition unit which adds a desired phase delay to the received input signal. Moreover, there is provided a first output signal generation unit having two input terminals. The first output signal generation unit receives the input signal through one of the input terminals and receives the phase delayed signal output from the delay addition unit through the other input terminal. The first output signal generation unit generates a first output signal based on a phase difference between the received input signal and the phase delayed signal. In addition, there is provided a signal inverting unit which receives and inverts the input signal. Furthermore, there is provided a second output signal generation unit having two input terminals. The second output signal generation unit receives the inverted input signal output from the signal inverting unit through one of the input terminals and receives the phase delayed signal output from the delay addition unit through the other input terminal. The second output signal generation unit generates a second output signal based on a phase difference between the received inverted input signal and the phase delayed signal.

Other objects and features of this invention will become apparent from the following description with reference to the accompanying drawings.

BRIEF DESCRIPTION OF THE DRAWINGS

FIG. 2 is a diagram showing a configuration of a conventional four-phase signal generator.

DETAILED DESCRIPTIONS

Embodiments of the polyphase signal generator according to the present invention will be explained by referring to the accompanying drawings. This invention is not restricted by the embodiments.

Figure 1:
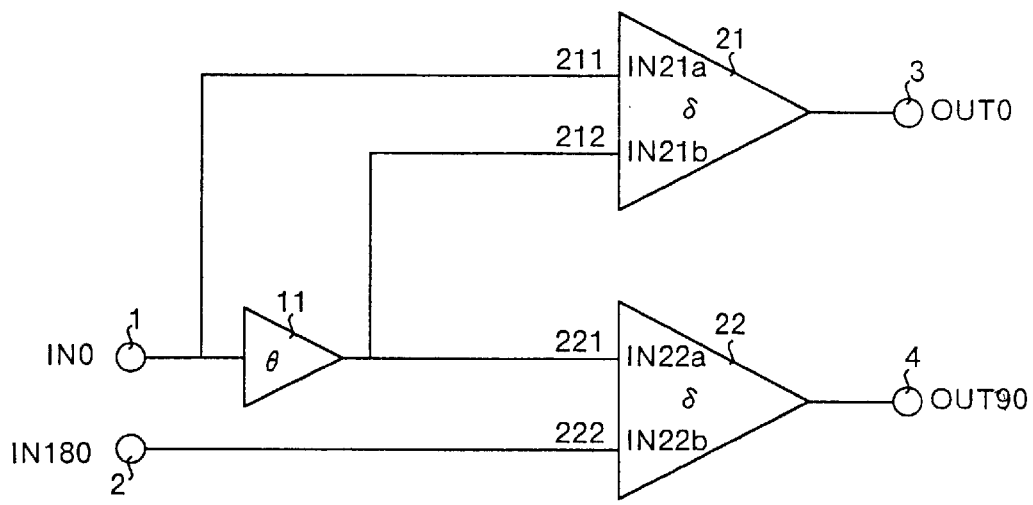
FIG. 1 is a diagram showing a configuration of a polyphase signal generator according to the present invention.

FIG. 1 is a diagram showing a configuration of a polyphase signal generator according to the present invention. Operation of a four-phase signal generator will now be explained as an example of a polyphase signal generator. In FIG. 1, reference numeral 1 denotes a first signal input terminal, 2 denotes a second signal input terminal, 3 denotes a first signal output terminal, 4 denotes a second signal output terminal, 11 denotes a first delay circuit, 12 denotes a second delay circuit, 21 denotes a first phase interpolation circuit, 22 denotes a second phase interpolation circuit, 211 denotes a third signal input terminal, 212 denotes a fourth signal input terminal, 221 denotes a fifth signal input terminal, and 222 denotes a sixth signal input terminal. Each phase interpolation circuit has an internal configuration similar to that of FIG. 3.

The configuration of the four-phase signal generator of FIG. 1 differs from the configuration of the four-phase signal generator shown in FIG. 2 in that the third signal input terminal 211 is connected to the first signal input terminal 1. Moreover, in FIG. 1, the fifth signal input terminal 221 is connected to an output of the first delay circuit 11.

Operation of the four-phase signal generator of the present embodiment will now be explained. In the present embodiment, the first delay circuit 11 provides a phase delay θ. The first phase interpolation circuit 21 and the second phase interpolation circuit 22 having the same configuration provide equal internal phase delays δ.

Signals spaced in phase 180 degrees apart are input to the first signal input terminal 1 and the second signal input terminal 2. A signal phase IN0 of the first signal input terminal 1 and a signal phase IN180 of the second signal input terminal 2 can be represented by the equations (1) and (2), respectively.

An output of the first delay circuit 11 is connected to both the third signal input terminal 211 and the fourth signal input terminal 212. As regards the phases, therefore, the following equations are satisfied.

$$IN21a = IN0 = 0 \quad (16)$$

$$IN21b = IN0 + \theta = \theta \quad (17)$$

As for the fifth signal input terminal 221 and the sixth signal input terminal 222, the following equations are satisfied as regards signal phases.

$$IN22a = IN0 + 0 = 0 \quad (18)$$

$$IN22b = IN180 = 180 \quad (19)$$

The first phase interpolation circuit 21 and the second phase interpolation circuit 22 output signals with output phases represented by the equation (6) and the equation (7) in response to two signal input phases. From the equations (16) to (19), therefore, an output OUT0 of the first phase interpolation circuit 21 and an output OUT90 of the second phase interpolation circuit 22 can be represented by the following equations.

$$\begin{aligned} OUT0 &= \delta + (IN21a + IN21b)/2 \\ &= \delta + (0 + \theta)/2 \\ &= \delta + \theta/2 \end{aligned} \quad (20)$$

$$\begin{aligned} OUT90 &= \delta + (IN22a + IN22b)/2 \\ &= \delta + (\theta + 180)/2 \\ &= \delta + \theta/2 + 90 \end{aligned} \quad (21)$$

Figure 3:
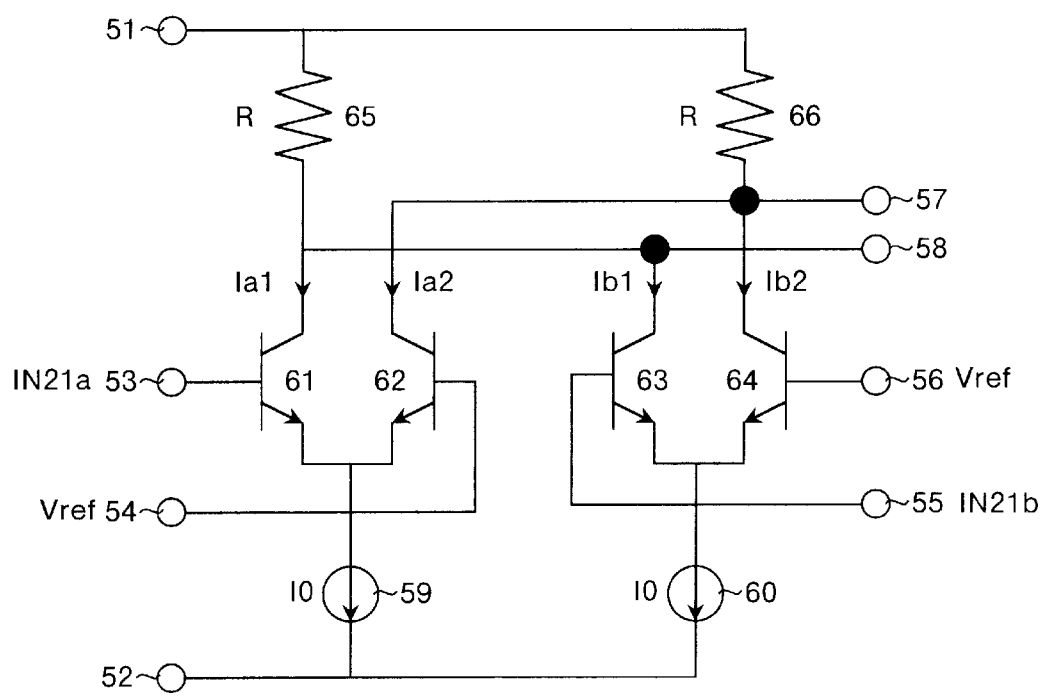
FIG. 3 is a diagram showing an internal configuration of each phase interpolation circuit.

Operation of the phase interpolation circuits will now be explained. As an example of the first phase interpolation circuit 21 and the second phase interpolation circuit 22, for example, the configuration of FIG. 3 is used. The first current source 59 and the second current source 60 flow currents of the same current value I0. The NPN transistors 61 to 64 have the same characteristic. The resistor 65 and the resistor 66 have the same resistance value R. The first positive-phase input terminal 53 is the third signal input terminal 211 shown in FIG. 3. The second positive-phase input terminal 55 is the fourth signal input terminal 212 shown in FIG. 3. Each of the first negative-phase input terminal 54 and the second negative-phase input terminal 56 is supplied with a reference voltage.

Supposing an input signal IN21a of the first positive-phase input terminal 53 and an input signal IN21b of the second positive-phase input terminal 55 to be sine waveforms, t to be time, $\phi$ (t) to be a phase at the time t, $\xi$ to be a phase difference between IN21a and IN21b, and Vref to be the reference voltage applied to the first negative-phase input terminal 54 and the second negative-phase input terminal 56, the input signal IN21a and the input signal IN21b can be represented by the equation (8) and the equation (9) in the same way as the foregoing explanation.

If each of a differential pair formed of the NPN transistors 61 and 62 and a differential pair formed of the NPN transistors 63 and 64 conducts a linear operation in response to its input signal, it divides a current source current I0 in proportion to an amplitude of the input signal. Supposing a high potential power supply voltage 51 to be Vcc, therefore, a collector current Ia1 of the NPN transistor 61, a collector current Ib1 of the NPN transistor 63, and an output voltage V2 of the negative-phase output terminal 58 can be represented by the equations (10), (11), and equation (12) in the same way as the foregoing explanation.

However, Vbias is a bias voltage of an output signal, and Vpp is the maximum amplitude of the output signal. This bias voltage and the amplitude can be represented by the equations (13) and (14), respectively. An output voltage V1 of the positive-phase output terminal 57 can also be represented by the equation (15) in the same way as the foregoing explanation.

Thus, in each phase interpolation circuit, the phase of the output signal becomes $\xi/2$ in response to the two input signals having the phase difference $\xi$, as represented by the equations (12) and (15). If, for example, the internal phase delay $\delta$ is added, therefore, the equations (6) and (7) regarding the phases are satisfied.

As explained above, the four-phase signal generator of the present embodiment has a configuration in which the signal phase of the first signal output terminal 3 and the signal phase of the second signal output terminal 4 always maintain the phase difference relation of 90 degrees irrespective of the phase delay $\theta$ of the first delay circuit 11 and the internal phase delay $\delta$ of the first phase interpolation circuit 21 and the second phase interpolation circuit 22, as evident from the equation (20) and the equation (21). In other words, even when the phase delays $\theta$ and $\delta$ are varied by a variation of an environment such as the operation temperature or the power supply voltage, four-phase signals spaced in phase accurately 90 degrees apart can be output by generating an inverted signal for the output signal of the first signal output terminal 3 and an inverted signal for the output signal of the second signal output terminal 4 from the output signal of the first signal output terminal 3 and the output signal of the second signal output terminal 4, according to the present embodiment.

Further, in the present embodiment, functions same as the conventional art can be implemented by using a circuit configuration which is smaller in scale as compared to the conventional art. Moreover, reduction of the power dissipation of the circuit can be implemented as a result of the size reduction.

The present invention brings about an effect that even when the phase delays caused by the delay addition unit and respective output signal generation units are varied by a variation of an environment such as the operation temperature or the power supply voltage, four-phase signals spaced in phase accurately 90 degrees apart can be output by generating an inverted signal for the first output signal and an inverted signal for the second output signal from the first output signal and the second output signal. Furthermore, the present invention brings about an effect that the similar function can be implemented by using a circuit configuration which is smaller in scale as compared with the conventional art and, in addition, reduction of the power dissipation of the circuit can be implemented as a result of the size reduction.

Moreover, the present invention brings about an effect that it is possible to implement a phase interpolation circuit in which in response to two input signals having a predetermined phase difference, the phase of the output signal becomes half of the predetermined phase difference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A polyphase signal generator comprising:
   a delay addition unit which adds a predetermined phase delay to an input signal;
   a first output signal generation unit which generates a first output signal having an output phase prescribed according to a phase difference between the input signal input to one terminal of the first output signal generation unit and a signal input to another terminal of the first output signal generation unit which is output from the delay addition unit; and a second output signal generation unit which generates a second output signal having an output phase prescribed according to a phase difference between a signal input to a one terminal of the second output signal generation unit which is output from the delay addition unit and an inverted signal of the input signal input to another terminal of the second output signal generation unit.

2. The polyphase signal generator according to claim 1, wherein each of the first and second output signal generation units comprises:

first and second current sources connected at one ends thereof to a low potential power supply;

first and second load elements connected at one ends thereof to a high potential power supply;

a first transistor connected at its emitter to another end of the first current source, connected at its collector to another end of the first load element, and connected at its base to the first input terminal;

a second transistor connected at its emitter to the another end of the first current source, connected at its collector to another end of the second load element, and supplied at its base with a reference voltage;

a third transistor connected at its emitter to another end of the second current source, connected at its collector to the another end of the first load element, and connected at its base to the another input terminal; and a fourth transistor connected at its emitter to the another end of the second current source, connected at its collector to the another end of the second load element, and supplied at its base with a reference voltage, and the first output signal and the second output signal are output from the another end of the first load element and/or the another end of the second load element.

3. A polyphase signal generator comprising:

a signal receiving terminal which receives an input signal;

a delay addition unit which adds a desired phase delay to the received input signal;

a first output signal generation unit having two input terminals, the first output signal generation unit receiving the input signal through one of the input terminals and receiving the phase delayed signal output from the delay addition unit through the other input terminal, the first output signal generation unit generating a first output signal based on a phase difference between the received input signal and the phase delayed signal;

a signal inverting unit which inverts the input signal; and a second output signal generation unit having two input terminals, the second output signal generation unit receiving the inverted input signal output from the signal inverting unit through one of the input terminals and receiving the phase delayed signal output from the delay addition unit through the other input terminal, the second output signal generation unit generating a second output signal based on a phase difference between the received inverted input signal and the phase delayed signal.

* * * * *